(12) United States Patent
Chang et al.

(10) Patent No.: US 9,913,408 B1
(45) Date of Patent: Mar. 6, 2018

(54) WATERPROOF CABINET AND CONTAINER DATA CENTER USING THE SAME

(71) Applicants: HONGFUJIN PRECISION ELECTRONICS (TIANJIN) CO., LTD., Tianjin (CN); HON HAI PRECISION INDUSTRY CO., LTD., New Taipei (TW)

(72) Inventors: Chih-Hung Chang, New Taipei (TW); Tze-Chern Mao, New Taipei (TW); Yen-Chun Fu, New Taipei (TW)

(73) Assignees: HONGFUJIN PRECISION ELECTRONICS (TIANJIN) CO., LTD., Tianjin (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/331,911

(22) Filed: Oct. 23, 2016

(30) Foreign Application Priority Data

Sep. 6, 2016 (CN) .......................... 2016 1 0803566

(51) Int. Cl.
*H05K 7/20* (2006.01)
*H05K 5/02* (2006.01)
*H05K 7/14* (2006.01)

(52) U.S. Cl.
CPC ....... *H05K 7/20827* (2013.01); *H05K 5/0221* (2013.01); *H05K 7/1488* (2013.01); *H05K 7/1497* (2013.01)

(58) Field of Classification Search
CPC ............. H05K 7/20827; H05K 7/1479; H05K 5/0221; F24F 1/0003; F24F 1/02
USPC .............. 361/627, 727, 724; 62/298; 49/413
See application file for complete search history.

(56) References Cited

U.S. PATENT DOCUMENTS 3,884,048 A * 5/1975 Schneider .......... B60H 1/00378
62/298
6,662,588 B2 * 12/2003 Houk .................... H05K 7/2059
62/298

* cited by examiner

*Primary Examiner* — Dion R Ferguson
*Assistant Examiner* — Mandeep S Buttar
(74) *Attorney, Agent, or Firm* — ScienBiziP, P.C.

(57) ABSTRACT

A waterproof cabinet includes a cabinet body, a cooling device and a waterproof device. The cabinet body includes a gate, the cooling device is slidably received in the cabinet body via the gate. The waterproof cabinet can be switched between a storage state, where the cooling device is accommodated in the cabinet body, and a working state, where the cooling device is located out of the cabinet body and the connection portions of the cooling device and the cabinet body are sealed by the waterproof device. A container data center is further disclosed.

16 Claims, 2 Drawing Sheets

WATERPROOF CABINET AND CONTAINER DATA CENTER USING THE SAME

FIELD

The subject matter herein generally relates to a waterproof cabinet and container data centers using the waterproof cabinet.

BACKGROUND

With the development of electronic information industry, data centers, especially container data centers are widely applied. The container data center is a mini data center solution that features low cost, high integration degree, high energy efficiency, high flexibility, and fast deployment, and is gradually used by major operators. Different vendors propose different deployment or maintenance solutions to address the problem of deploying a container data center with the requirements of high density and small maintenance space.

As a part of the refrigerating system of a container data center, arrangement of an external unit of an air conditioner becomes important. The external unit of an air conditioner is generally mounted outside of a container by ledges.

BRIEF DESCRIPTION OF THE DRAWINGS

Implementations of the present technology will now be described, by way of example only, with reference to the attached figures.

DETAILED DESCRIPTION

Figure 1:
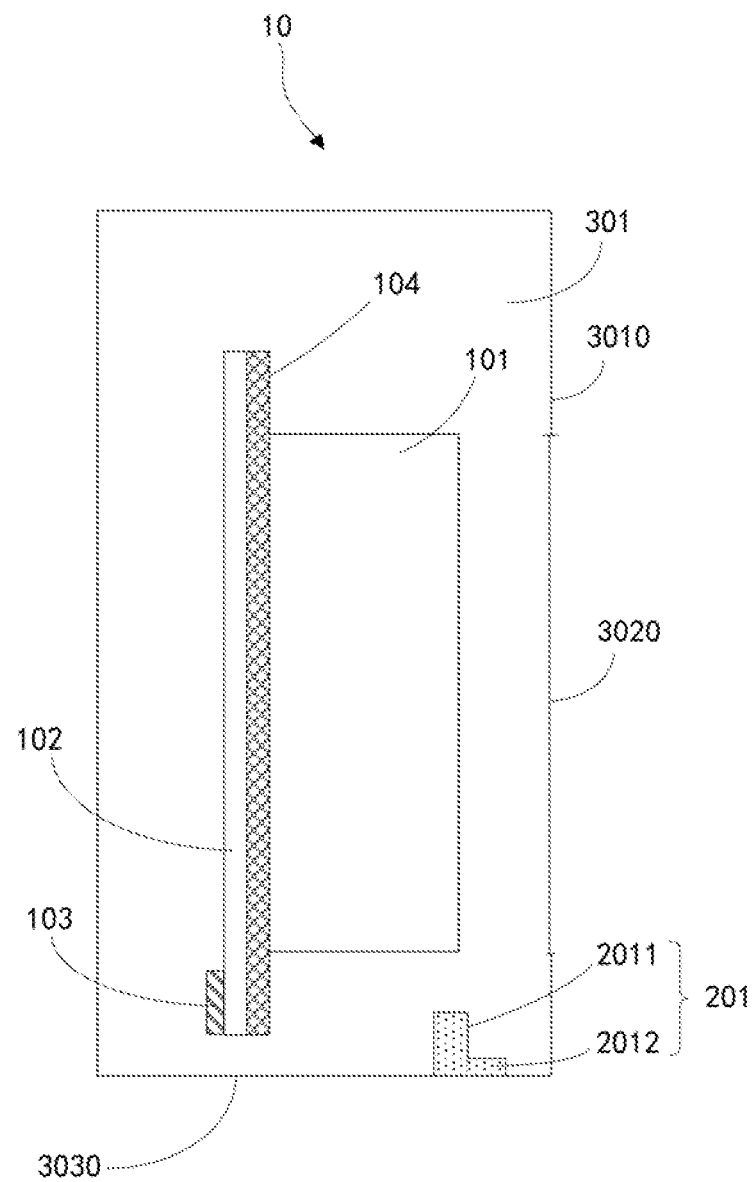
FIG. 1 is a sectional, side view of a waterproof cabinet in a storage state.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series and the like.

Figure 2:
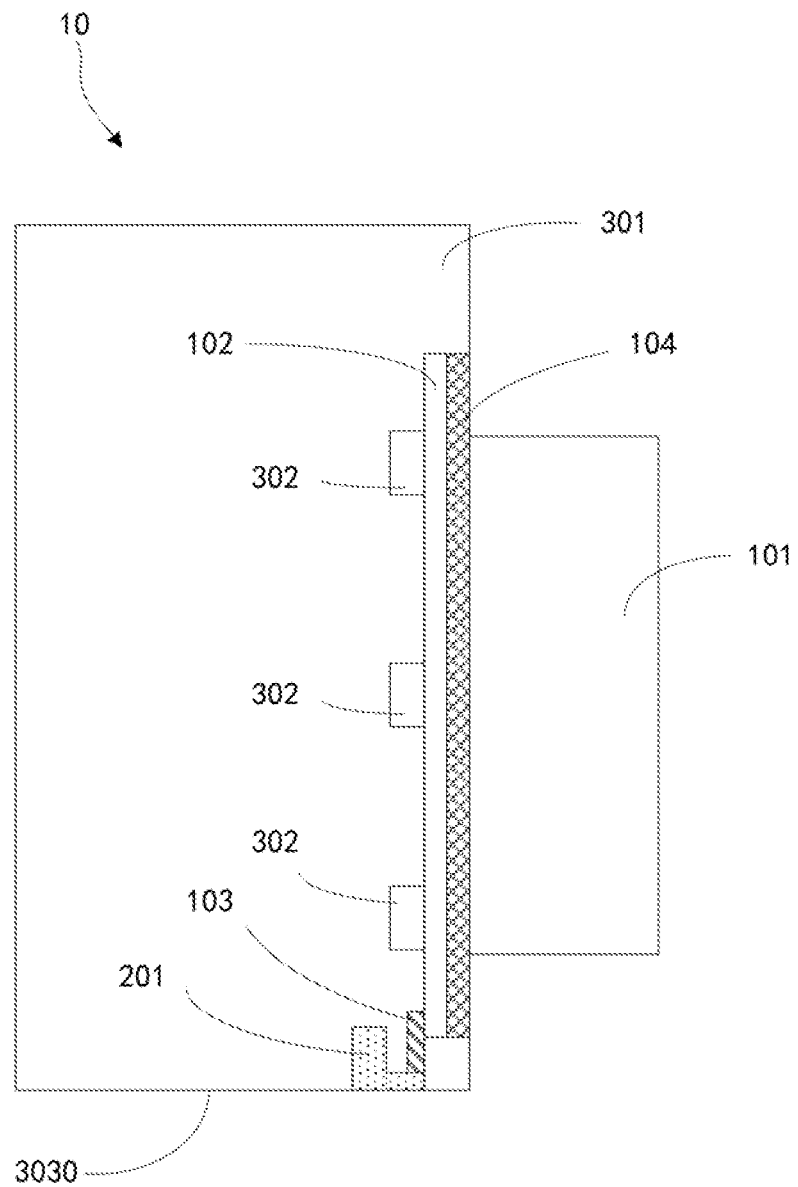
FIG. 2 is sectional, side view of the waterproof cabinet of FIG. 1 in a working state.

FIGS. 1 and 2 illustrate a waterproof cabinet 10 in a preferred embodiment.

The waterproof cabinet 10 includes a cabinet body 301, a cooling device 101 and a waterproof device. The cabinet body 301 can be shaped as a rectangular container, the cabinet body 301 includes a gate 3020 corresponding to the cooling device 101. The cooling device 101 can be slidably received in the cabinet body 301 and can be slid out of the cabinet body 301 through the gate 3020. In at least one embodiment, a sliding rail can be fixed on the bottom of the cabinet body 301, and a sliding block corresponding with the sliding rail can be fixed under the cooling device 101 the cooling device 101 can be slid on the sliding rail via the sliding block. The cooling device 101 can be an external unit of an air conditioner.

The waterproof cabinet 10 can be switched between a storage state and a working state. When the waterproof cabinet 10 is on a storage state, such as in transportation, the cooling device 101 is accommodated in the cabinet body 301 so as to avoid being exposed and corrosion caused by exposure. When the waterproof cabinet 10 is on a working state, the cooling device 101 can be slid out of the cabinet body 301, connection portions of the cooling device 101 and the cabinet body 301 can be sealed by the waterproof device.

The waterproof cabinet 10 can further include a watertight plate 104 and a locking device 302. The watertight plate 104 can be mounted to a rear side of the cooling device 101 along a sliding out direction of the cooling device 101. The locking device 302 can be fixed to the cabinet body 301 and abuts the watertight plate 104.

When the waterproof cabinet 10 is on a working state, the cooling device 101 can be slid out of the cabinet body 301 via the gate 3020, the connection portions of the cooling device 101 and the gate 3020 can be sealed by the watertight plate 104, and then the watertight plate 104 can be locked by the locking device 302. Correspondingly, the locking device 302 can be mounted on a side wall 3010 of the cabinet body 301.

The watertight plate 104 can be made of compressible sealing materials, when the watertight plate 104 is compressed and locked by the locking device 302, non-uniform deformation may be caused by the uneven distribution of pressure, in view of this, a locking plate 102 can be attached to the watertight plate 104. When the cooling device 101 is located out of the cabinet body 301, the watertight plate 104 fits together with the connection portions of the cooling device 101 and the gate 3020, the locking device 302 compresses the locking plate 102, the watertight plate 104 is compressed by the locking plate 104 and thereby locked by the locking device 302. The locking plate 104 can be a rigid plate made of glass or plastic to evenly distribute pressure of the locking device 302 to the watertight plate 104.

The locking device 302 can include a plurality of eccentric mechanisms, the eccentric mechanisms are evenly distributed around the locking plate 102. When the cooling device 101 is located out of the cabinet body 301, the watertight plate 104 fits together with the connection portions of the cooling device 101 and the gate 302 and the watertight plate is compressed by the locking plate 102 under compression of the eccentric mechanisms. It is understood that the locking device 302 also can be chosen from other kinds of locking mechanisms, such as thread locking mechanism.

The waterproof device 10 can further include a sealing part 201 located on bottom of the cabinet body 301. When the cooling device 101 is located out of the cabinet body 301, a lower side of the locking plate 102 and the bottom of the cabinet body 301 can be connected and sealed by the sealing part 201. In at least one embodiment, the sealing part 201 can include a bottom plate 2012 and a side plate 2011 perpendicularly connected to the bottom plate 2012. The bottom plate 2012 is fixed to the bottom wall 3030 of the cabinet body 301, the side plate 2011 is perpendicularly connected to the bottom plate 2012 and forms a substantially "L" shaped structure together with the bottom plate 2012. The bottom plate can be welded to the bottom wall 3030 of the cabinet body 301, the side plate 2011 can be perpendicularly connected to a back side of the bottom plate 2012 along a sliding out direction of the cooling device 101.

When the cooling device 101 is located out of the cabinet body 301, the lower side of the locking plate 102 is connected to and sealed by the side plate 2011, thereby seals the lower end of the watertight plate 104 and the bottom wall 3030 of the cabinet body 301.

The waterproof device can further include a water retaining part 103. The water retaining part 103 is slidably connected to a lower side of the locking plate 102. When the cooling device 101 is located out of the cabinet body 301, the water retaining part 103 slides down to connect and seal the lower side of the locking plate 102 and the sealing part 201. When the cooling device 101 is accommodated in the cabinet body 301, the water retaining part 103 slides up and separates with the sealing part 201.

A container data center is further disclosed. The container data center includes a container and a plurality of waterproof cabinets 10 arranged in the container.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A waterproof cabinet comprising:
a cabinet body comprising a gate;
a cooling device slidably received in the cabinet body via the gate; and
a waterproof device comprising a watertight plate mounted to a rear side of the cooling device along a sliding out direction of the cooling device;
wherein the waterproof cabinet is switchable between a storage state, where the cooling device is accommodated in the cabinet body, and a working state, where the cooling device is located out of the cabinet body, the cooling device and the cabinet body are sealed by the watertight plate, and wherein the waterproof device further comprises a locking device fixed to the cabinet body and abuts the watertight plate; when the cooling device is located out of the cabinet body, the cooling device and the cabinet body are sealed by the watertight plate and the watertight plate is locked by the locking device, the waterproof device further comprises a locking plate attached to the watertight plate, when the cooling device is located out of the cabinet body, the watertight plate fits together with the cooling device and the cabinet body and the watertight plate is locked by the locking device via the locking plate.

2. The waterproof cabinet of claim 1, wherein the locking device comprises a plurality of eccentric mechanisms distributed around the locking plate, the watertight plate is made of compressible sealing material;
when the cooling device is located out of the cabinet body, the watertight plate fits together with the cooling device and the cabinet body and the watertight plate is compressed by the locking plate under compression of the eccentric mechanisms.

3. The waterproof cabinet of claim 1, wherein the waterproof device further comprises a sealing part located on bottom of the cabinet body;
when the cooling device is located out of the cabinet body, a lower side of the locking plate and the bottom of the cabinet body are connected and sealed by the sealing part.

4. The waterproof cabinet of claim 3, wherein the sealing part comprises a bottom plate fixed to the bottom of the cabinet body and a side plate perpendicularly connected to the bottom plate;
when the cooling device is located out of the cabinet body, the lower side of the locking plate is connected to and sealed by the side plate.

5. The waterproof cabinet of claim 4, wherein the bottom plate is welded to the bottom of the cabinet body, the side plate is perpendicularly connected to a back side of the bottom plate along a sliding out direction of the cooling device.

6. The waterproof cabinet of claim 3, wherein the waterproof device further comprises a water retaining part slidably connected to a lower side of the locking plate;
when the cooling device is located out of the cabinet body, the water retaining part slides down to connect and seal the lower side of the locking plate and the bottom of the cabinet body;
when the cooling device is accommodated in the cabinet body, the water retaining part slides up and separates with the sealing part.

7. The waterproof cabinet of claim 1, wherein the cabinet body is shaped as a rectangular container.

8. The waterproof cabinet of claim 1, wherein the cooling device is an external unit of an air conditioner.

9. A container data center comprising:
a container; and
a plurality of waterproof cabinets arranged in the container, each of the waterproof cabinets comprising:
a cabinet body comprising a gate;
a cooling device slidably received in the cabinet body via the gate; and
a waterproof device;
wherein the waterproof cabinet can be switched between a storage state, where the cooling device is accommodated in the cabinet body, and a working state, where the cooling device is located out of the cabinet body and the cooling device and the cabinet body are sealed by the waterproof device; and
wherein the waterproof device comprises:
a watertight plate mounted to a back side of the cooling device along a sliding out direction of the cooling device;
a locking device fixed to the cabinet body and abuts the watertight plate;
when the cooling device is located out of the cabinet body, the cooling device and the cabinet body are sealed by the watertight plate and the watertight plate is locked by the locking device; wherein the waterproof device further comprises a sealing part located on bottom of the cabinet body; when the cooling device is located out of the cabinet body, a lower side of the locking plate and the bottom of the cabinet body are connected and sealed by the sealing part.

10. The container data center of claim 9, wherein the waterproof device further comprises a locking plate attached to the watertight plate, when the cooling device is located out of the cabinet body, the watertight plate fits together with the cooling device and the cabinet body and the watertight plate is locked by the locking device via the locking plate.

11. The container data center of claim 9, wherein the locking device comprises a plurality of eccentric mechanisms distributed around the locking plate, the watertight plate is made of compressible sealing material;
when the cooling device is located out of the cabinet body, the watertight plate fits together with the cooling device and the cabinet body and the watertight plate is compressed by the locking plate under compression of the eccentric mechanisms.

12. The container data center of claim 9, wherein the sealing part comprises a bottom plate fixed to the bottom of the cabinet body and a side plate perpendicularly connected to the bottom plate;
when the cooling device is located out of the cabinet body, the lower side of the locking plate is connected to and sealed by the side plate.

13. The container data center of claim 12, wherein the bottom plate is welded to the bottom of the cabinet body, the side plate is perpendicularly connected to a back side of the bottom plate along a sliding out direction of the cooling device.

14. The container data center of claim 9, wherein the waterproof device further comprises a water retaining part slidably connected to a lower side of the locking plate;
when the cooling device is located out of the cabinet body, the water retaining part slides down to connect and seal the lower side of the locking plate and the bottom of the cabinet body;
when the cooling device is accommodated in the cabinet body, the water retaining part slides up and separates with the sealing part.

15. The container data center of claim 9, wherein the cabinet body is shaped as an rectangular container.

16. The container data center of claim 9, wherein the cooling device is an external unit of an air conditioner.

* * * * *